(12) United States Patent
Hishida et al.

(10) Patent No.: US 9,324,446 B2
(45) Date of Patent: Apr. 26, 2016

(54) NON-VOLATILE SEMICONDUCTOR STORAGE DEVICE, AND MEMORY SYSTEM

(71) Applicant: KABUSHIKI KAISHA TOSHIBA, Tokyo (JP)

(72) Inventors: Tomoo Hishida, Kamakura (JP); Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 14/192,404

(22) Filed: Feb. 27, 2014

(65) Prior Publication Data

US 2015/0138886 A1    May 21, 2015

(30) Foreign Application Priority Data

Nov. 15, 2013   (JP) ................................ 2013-237449

(51) Int. Cl.
| | |
|---|---|
| *G11C 11/34* | (2006.01) |
| *G11C 16/34* | (2006.01) |
| *G11C 16/04* | (2006.01) |
| *G11C 16/08* | (2006.01) |

(52) U.S. Cl.
CPC ........ *G11C 16/3427* (2013.01); *G11C 16/0483* (2013.01); *G11C 16/08* (2013.01)

(58) Field of Classification Search
USPC .................................................... 365/185.11
See application file for complete search history.

(56) References Cited

U.S. PATENT DOCUMENTS

| | | | | | |
|---|---|---|---|---|---|
| 7,852,675 | B2 * | 12/2010 | Maejima | ................... | G11C 5/02 365/185.05 |
| 7,852,676 | B2 * | 12/2010 | Maejima | ................... | G11C 5/02 365/185.11 |
| 8,372,720 | B2 | 2/2013 | Fukuzumi et al. | | |
| 8,456,918 | B2 * | 6/2013 | Oh | ......................... | G11C 16/10 365/185.02 |
| 9,190,151 | B2 * | 11/2015 | Nam | ................... | G11C 16/0483 |
| 2009/0267128 | A1 * | 10/2009 | Maejima | ........... | H01L 27/11565 257/314 |
| 2011/0019486 | A1 * | 1/2011 | Jang | ................... | G11C 16/0483 365/185.25 |

(Continued)

FOREIGN PATENT DOCUMENTS

JP    2007-266143 A    10/2007

OTHER PUBLICATIONS

Taiwan Office Action dated Oct. 28, 2015, filed in Taiwan counterpart Application No. 103106136, 7 pages (with translation).

*Primary Examiner* — Hoai V Ho
*Assistant Examiner* — Pablo Huerta
(74) *Attorney, Agent, or Firm* — Patterson & Sheridan, LLP

(57) ABSTRACT

A non-volatile semiconductor storage device includes an memory cell array including first and second blocks, each of which includes a plurality of memory strings each having n (n: natural number) memory cells, and a optionally a peripheral circuit for controlling the memory cell array. In this non-volatile semiconductor storage device, n signal lines are arranged in the first block, and m (n>m, m: natural number) signal lines are arranged in the second block, such that the second block size is smaller than the first block size.

18 Claims, 14 Drawing Sheets

6A-6A' CROSS-SECTIONAL VIEW

(56) References Cited

U.S. PATENT DOCUMENTS

| | | | | |
|---|---|---|---|---|
| 2011/0058427 A1* | 3/2011 | Choi | | G11C 16/0483 365/185.25 |
| 2011/0075484 A1* | 3/2011 | Lee | | G11C 16/0408 365/185.17 |
| 2011/0116322 A1* | 5/2011 | Seol | | G11C 16/0483 365/185.25 |
| 2011/0235424 A1* | 9/2011 | Pyeon | | G11C 16/0483 365/185.17 |
| 2011/0284946 A1 | 11/2011 | Kiyotoshi | | |
| 2012/0020155 A1* | 1/2012 | Kim | | G11C 11/5628 365/185.03 |
| 2012/0257452 A1* | 10/2012 | Kim | | G11C 16/0483 6/483 |
| 2013/0273700 A1* | 10/2013 | Rabkin | | H01L 29/6675 438/158 |
| 2015/0063033 A1* | 3/2015 | Dong | | G11C 16/0483 365/185.17 |
| 2015/0078090 A1* | 3/2015 | Rabkin | | H01L 29/6675 365/185.17 |

* cited by examiner

OPERATION OF MEMORY CONTROLLER 3 UPON SUPPLYING POWER SUPPLY

OPERATION OF MEMORY CONTROLLER 3 UPON READING DATA

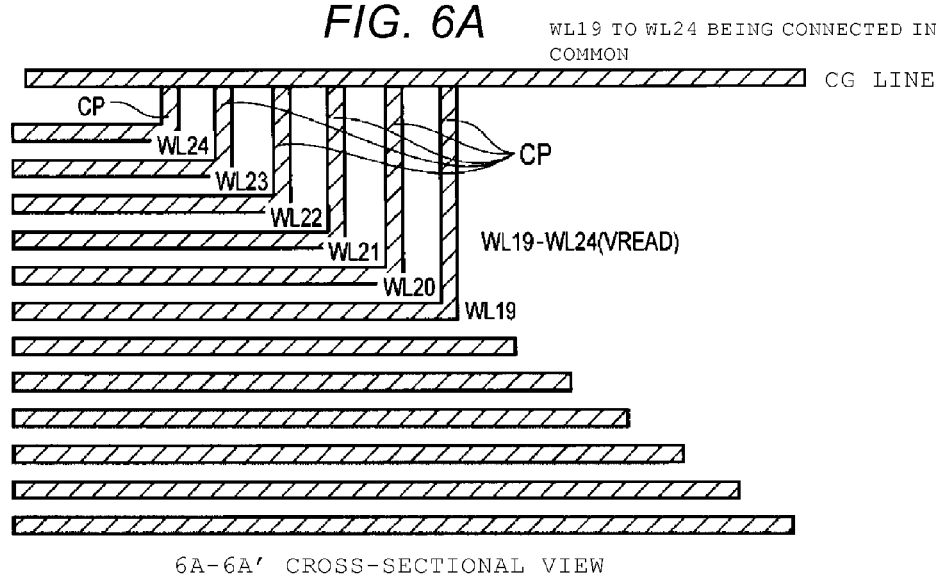
FIG. 6A — WL19 TO WL24 BEING CONNECTED IN COMMON
6A-6A' CROSS-SECTIONAL VIEW
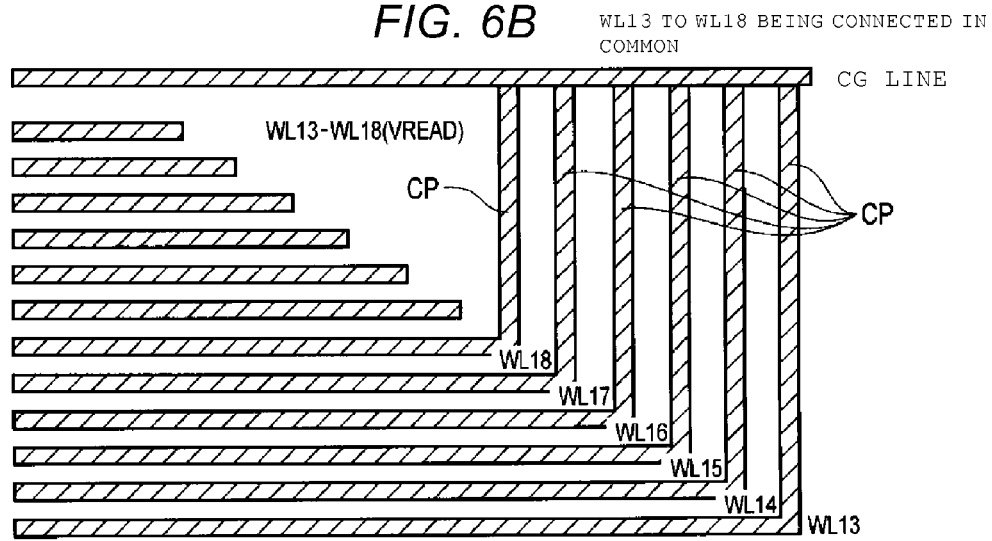
FIG. 6B — WL13 TO WL18 BEING CONNECTED IN COMMON
6B-6B' CROSS-SECTIONAL VIEW 6C-6C' CROSS-SECTIONAL VIEW 6D-6D' CROSS-SECTIONAL VIEW 6E-6E' CROSS-SECTIONAL VIEW 6F-6F' CROSS-SECTIONAL VIEW 10-10' CROSS SECTION 11-11' CROSS SECTION

NON-VOLATILE SEMICONDUCTOR STORAGE DEVICE, AND MEMORY SYSTEM

CROSS-REFERENCE TO RELATED APPLICATION

This application is based upon and claims the benefit of priority from Japanese Patent Application No. 2013-237449, filed Nov. 15, 2013, the entire contents of which are incorporated herein by reference.

FIELD

Embodiments described herein relate to a non-volatile semiconductor storage device and a memory system.

BACKGROUND

Recently, a semiconductor memory has been developed in which memory cells are stacked (e.g., BiCS: Bit Cost Scalable Flash Memory). With such a configuration, a semiconductor memory having a large capacity may be realized at low cost.

DESCRIPTION OF THE DRAWINGS

FIG. 4A and FIG. 4B are schematic diagrams showing a distribution of threshold value of a memory cell according to the first embodiment, wherein FIG. 4A shows a distribution of threshold value of the memory cell formed in a first block and, FIG. 4B shows a distribution of threshold value of the memory cell formed in a second block.

FIG. 5A and FIG. 5B are flowcharts showing the manner of operation of a memory controller according to the first embodiment, wherein FIG. 5A is a flowchart showing the manner of operation when a memory system is started, and FIG. 5B is a flowchart of a method that is carried out upon performing a reading operation.

FIG. 6A is a cross-sectional view of a memory cell array according to the first embodiment, and illustrates a concept of supplying a reading voltage to word lines.

FIG. 6B is a cross-sectional view of the memory cell array according to the first embodiment, and also illustrates a concept of supplying a reading voltage to word lines.

FIG. 10A and FIG. 10B are views of a memory cell array according to a third embodiment, wherein FIG. 10A is a plan view, and FIG. 10B is a cross-sectional view taken along a line 10-10' in FIG. 10A.

FIG. 11A and FIG. 11B are views of the memory cell array according to a modification of the third embodiment, wherein FIG. 11A is a plan view, and FIG. 11B is a cross-sectional view taken along a line 11-11' in FIG. 11A.

DETAILED DESCRIPTION

According to an embodiment, there are provided a non-volatile semiconductor storage device provided with blocks having different sizes and a memory system.

In general, according to one embodiment, a non-volatile semiconductor storage device includes a memory cell array which includes a plurality of memory cells divided into first and second blocks, each of which includes a plurality of memory strings each having n (n: natural number) memory cells. In the non-volatile semiconductor storage device, n pieces of first signal lines extending in a first direction are arranged in the first block along a second direction different from the first direction, and the first signal lines are electrically connected to first word lines that are electrically connected to the memory cells in the first block. In addition, m (n>m, m: natural number) second signal lines extending in the first direction are arranged in the second block along the second direction, and the second signal lines are electrically connected to second word lines that are electrically connected to the memory cells in the second block, such that at least one of the second signal lines is electrically connected to more than one of the second word lines.

A non-volatile semiconductor storage device according to this embodiment adopts the structure where semiconductor memories are stacked. In the non-volatile semiconductor storage device, as a way to enhance a data holding characteristic, the influence of disturbance is suppressed, and memory cells MC having excellent data holding characteristic are used when necessary so that the reliability of the storage device is enhanced.

As one such way to enhance the reliability of the storage device, the storage device adopts the structure where a semiconductor memory which is liable to generate a defect in the block BLK is used only if necessary. Accordingly, blocks having different sizes are formed in the memory cell array.

First Embodiment

Figure 1:
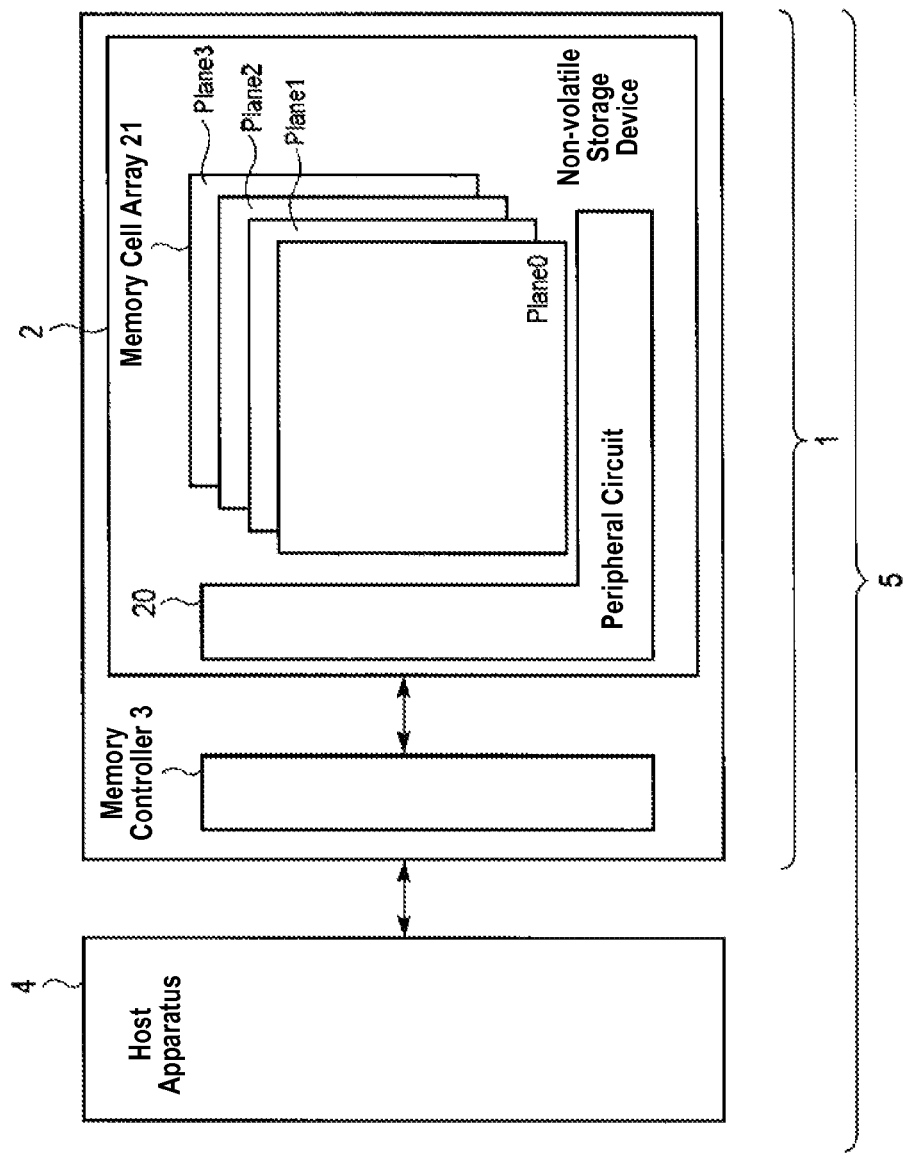
FIG. 1 is a schematic diagram of a memory system according to a first embodiment.

The first embodiment is described with reference to FIG. 1. FIG. 1 is a schematic diagram of a semiconductor device 1 and host equipment 4 according to the first embodiment. The semiconductor device 1 includes a non-volatile semiconductor storage device 2 and a memory controller 3.

1. Overall Configuration

As shown in FIG. 1, the memory controller 3 (control circuit) according to the first embodiment controls the non-volatile semiconductor storage device 2.

To be more specific, the memory controller 3 executes a writing operation, a reading operation, an erasing operation and the like on the non-volatile semiconductor storage device 2.

Upon execution of the writing operation and the reading operation, the memory controller 3 performs transmission and reception of data with the non-volatile semiconductor storage device 2.

Examples of the semiconductor device 1 including the non-volatile semiconductor storage device 2 and the memory controller 3 include an SD™ card and a solid state drive (SSD).

The semiconductor device 1 may be connected to the host apparatus 4 arranged outside the semiconductor device 1, and the semiconductor device 1 and the host apparatus 4 constitute a memory system 5. The semiconductor device 1 is operated in accordance with a control performed by the host apparatus 4.

1.1 <Non-Volatile Semiconductor Storage Device 2>

The non-volatile semiconductor storage device 2 includes a memory cell array 21 (Plane0 to Plane3 in the drawing, for example) and a peripheral circuit 20 which controls the memory cell array 21. The memory cell array 21 and the peripheral circuit 20 are electrically connected to each other through contact plugs and signal lines.

1.1.1 <Plane0 to Plane3>

Each of the Plane0 to Plane3 includes a plurality of memory cells MC which store data. The memory cells MC are formed in the normal direction of a semiconductor substrate. That is, each of the Plane0 to Plane3 adopts a stacked structure.

The configuration of the memory cell array 21 is described in U.S. patent application Ser. No. 12/407,403 "three dimensional stacked nonvolatile semiconductor memory" filed on Mar. 19, 2009, for example. The configuration of the memory cell array 21 is also described in U.S. patent application Ser. No. 12/406,524 "three dimensional stacked nonvolatile semiconductor memory" filed on Mar. 18, 2009, U.S. patent application Ser. No. 12/679,991 "non-volatile semiconductor storage device and method of manufacturing the same" filed on Mar. 25, 2010, and U.S. patent application Ser. No. 12/532,030 "semiconductor memory and method for manufacturing the same" filed on Mar. 23, 2009. The entire contents of the above-mentioned patent applications are incorporated herein by reference.

2.1.1 <Plan View>

Figure 2:
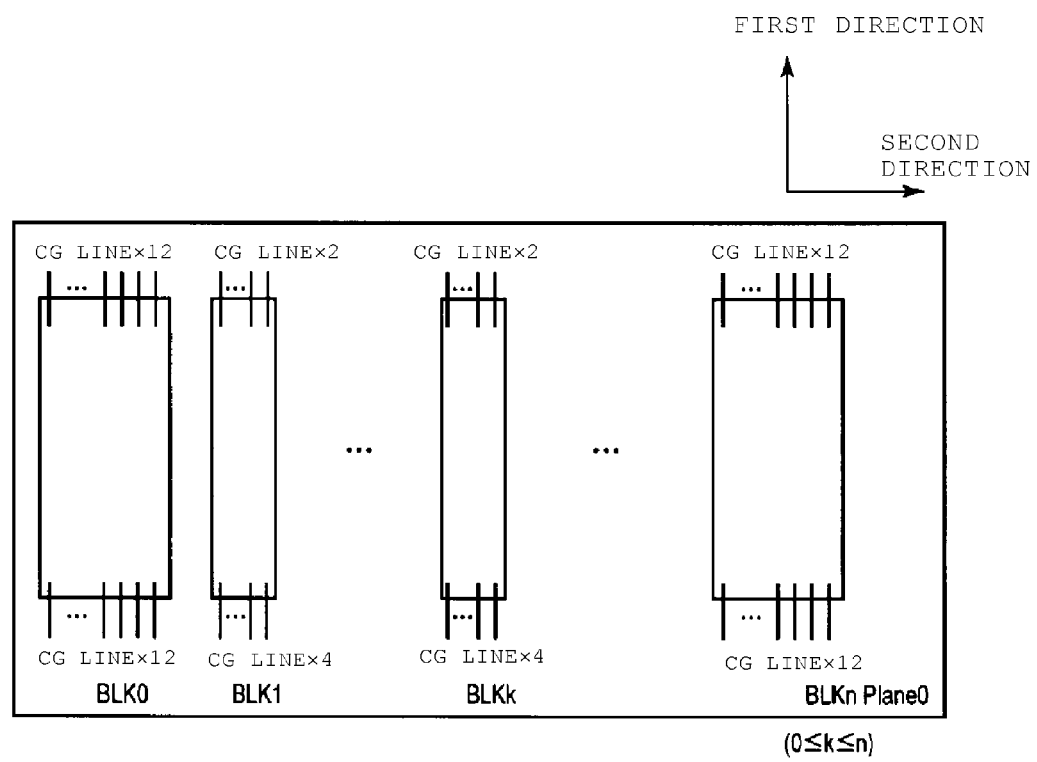
FIG. 2 is a schematic diagram of a block according to the first embodiment.

Next, FIG. 2 is a plan view (top plan view) of the Plane0, for example. The Plane1 to Plane3 have the same configuration as the Plane0 and hence, the explanation of the Plane1 to Plane3 is omitted.

As shown in FIG. 2, the Plane0 includes a block BLK0 to a block BLKn (n: natural number). Among the blocks BLK0 to BLKn, the block BLK0 and the block BLKn have a first block size, and the block BLK1 and the block BLKk (1≤k≤n) have a second block size smaller than the first block size.

If the number of stacked word lines WL in each block BLK is twelve, for example, twelve signal lines CG corresponding to twelve word lines WL which constitute the block BLK0 and the block BLKn respectively are connected to the block BLK0 and the block BLKn respectively.

The signal lines CG are formed in the first direction respectively corresponding to the word lines WL which are arranged in a comb-teeth shape as described later.

On the other hand, less than twelve signal lines CG are connected to the block BLK1 and the block BLKk respectively. As will be described later, this is because the block BLK1 and the block BLKk adopt the configuration where the plurality of word lines WL are connected in common when the word lines WL and the signal lines CG are connected to each other at hookup portions of the block BLK1 and block BLKk respectively.

The number of signal lines CG in the block BLK1 and the block BLKk is six, for example.

According to embodiments, the block BLK1 and the block BLKk may have the same block size, or may have different block sizes.

Hereinafter, a detail of the plan view of the Plane0 is described.

2.1.2 <Detail of Plan View>

Figure 3:
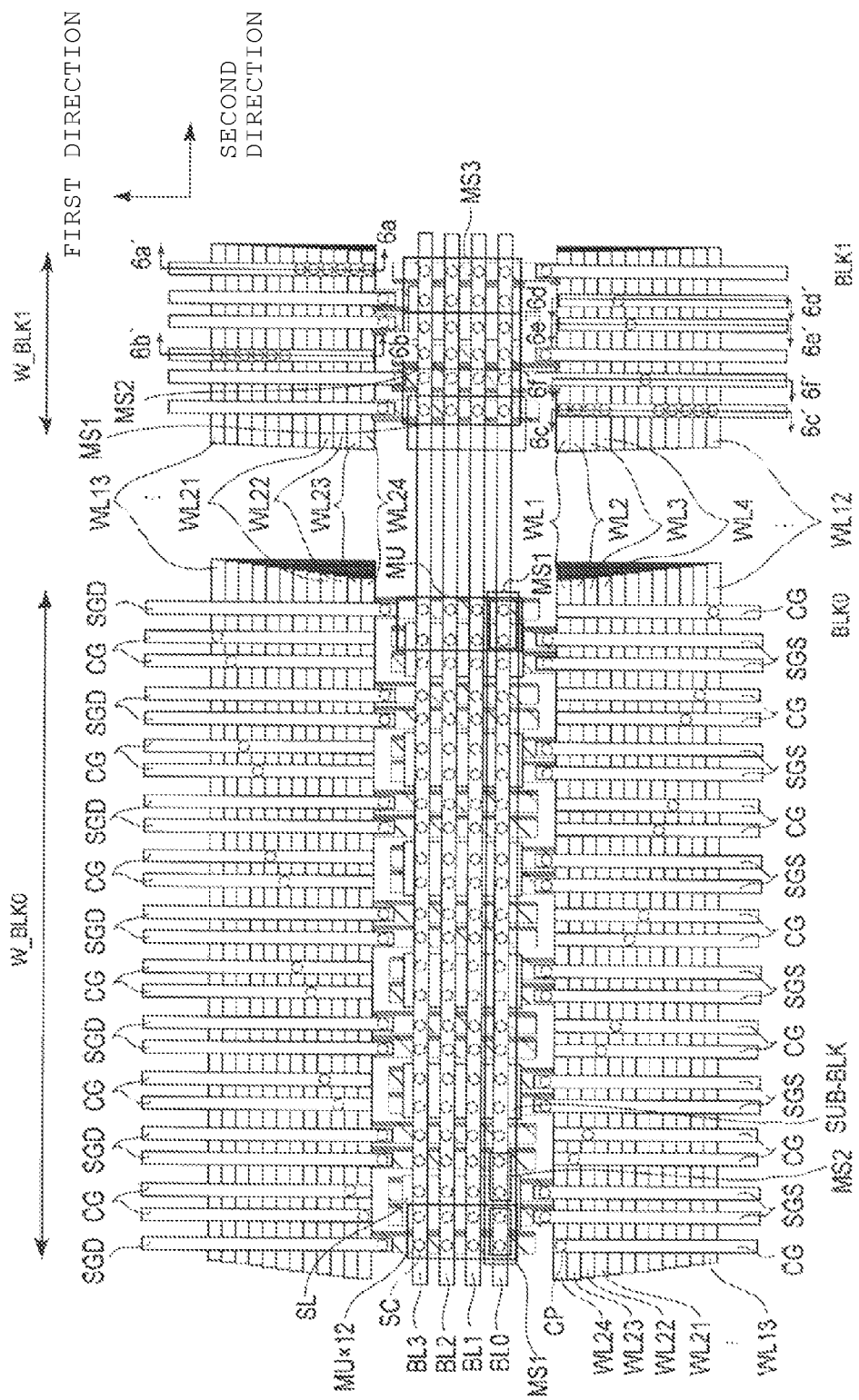
FIG. 3 is a plan view showing a detail of the block according to the first embodiment.

Next, a detail of the block BLK is described with reference to FIG. 3. FIG. 3 is a plan view showing a detail of the block BLK0 and the block BLK1 as one example. Also in the structure shown in FIG. 3, it is assumed that the number of stacked word lines WL in each block BLK is twelve.

2.1.2.1 <Block BLK0>

As shown in FIG. 3, the block BLK0 includes 12 memory string units MU. Each memory string unit MU includes four memory strings MS, for example.

A group of word lines WL which is arranged in the first direction in a comb-teeth shape is connected to the memory string unit MU. Bit lines BL0 to BL3 which are arranged in the second direction are connected to the memory string units MU, and semiconductor layers SC formed in the memory strings MS1 to MS12 respectively are connected to each other by the bit line BL in common.

Signal lines CG are connected to the respective word lines WL through contact plugs CP (indicated by a dotted circle in FIG. 3). The signal lines CG are arranged in the second direction.

In each memory string unit MU, an SGD line and an SGS line which extend in the first direction are arranged. The SGD line and the SGS line are connected to selection transistors ST1, ST2 through the contact plugs CP respectively. The SGD lines and the SGS lines are also arranged along the second direction.

That is, a size of the block BLK0 corresponds to a width of the block BLK0 in the second direction along which the signal lines CG, the SGD lines, and the SGS lines are arranged. It is assumed that a width of the block BLK0 is W_BLK0 in this embodiment.

In a region of the memory string unit MU, the semiconductor layers SC are formed in the direction toward a back surface of a paper on which the drawing is drawn (referred to as the third direction in the drawing) so as to penetrate the word lines WL. The semiconductor layer SC is formed by filling a Si layer in a memory hole MH. A memory cell MC is formed at an intersection of the semiconductor layer SC and the word line WL.

That is, when the word lines WL have twelve layers, twelve memory cells MC are formed in the direction toward the back surface of the paper on which the drawing is drawn.

As shown in the drawing, two semiconductor layers SC are formed in each memory string MS in the direction toward the back surface of the paper on which the drawing is drawn and hence, the memory string MS is formed of twenty four memory cells MC in total and the selection transistors ST1, ST2.

The memory strings MS2 to MS12 have the same structure as the memory string MS1 and hence, the explanation of the memory strings MS2 to MS12 is omitted.

An assembly formed of the memory strings MS1 to MS12 is referred to as a sub block SBLK (SUB-BLK in FIG. 3), and an assembly of the sub blocks SBLK constitutes a block BLK.

2.1.2.2 <Block BLK1>

Different from the block BLK0, the block BLK1 includes three memory string units MU. That is, one block BLK is formed of three memory string units MU. It is assumed that a width of the block BLK1 is W_BLK1 (<W_BLK0).

The reason the block BLK1 has a smaller block size than the block BLK0 even when the block BLK1 has the same number of stacked word lines WL as the block BLK1 is as follows. That is, among twelve layers, the memory cells MC corresponding to the word lines WL formed on the fifth, sixth and seventh layers counted from the top, for example, are used as regions where user data is stored, and other memory cells MC corresponding to the word lines WL formed on the zeroth to fourth layers and eighth to eleventh layers are not used.

As described above, in this embodiment, the blocks BLK having different block sizes are formed in the Plane0.

3. Threshold Voltage of Memory Cell MC

Figure 4A:
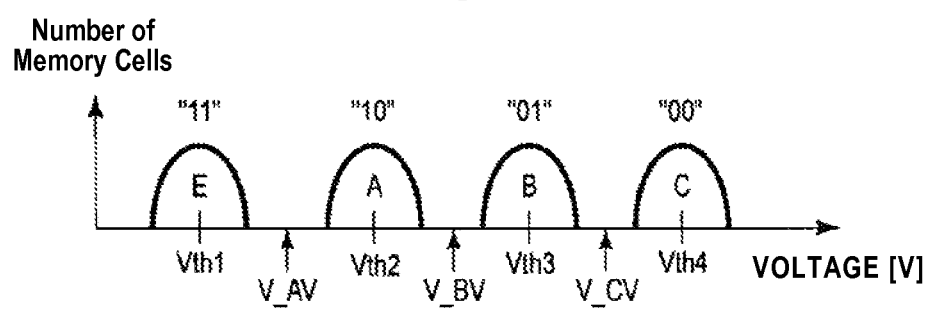

Next, a threshold voltage of the memory cell MC is described with reference to FIG. 4A and FIG. 4B. FIG. 4A is a schematic diagram showing a distribution of threshold value of data which the memory cells MC formed in the block BLK0 store, and FIG. 4B is a schematic diagram showing a distribution of threshold value of data which the memory cells MC formed in the word lines WL5 to WL7 in the block BLK1 store.

Figure 4B:
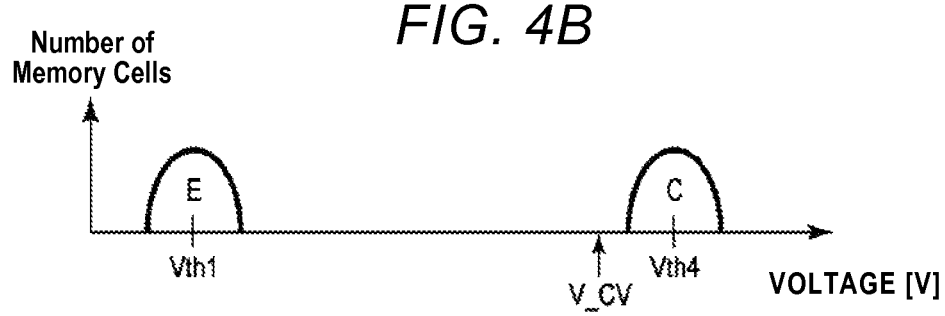

As shown in FIG. 4A, FIG. 4B, a threshold voltage is represented on an axis of abscissas, and the number of memory cells MC is represented on an axis of ordinates.

3.1 <FIG. 4A>

As shown in FIG. 4A, for example, four-value data (2 bit data) may be stored at a threshold voltage of the memory cells MC formed in the block BLK0.

That is, as shown in FIG. 4A, the memory cells MC in the block BLK0 may store any one of data selected from a group including data at "E" level ("11"), data at "A" level ("10"), data at "B" level ("01"), and data at "C" level ("00") in an ascending order of a threshold voltage Vth. The stored data corresponding to the threshold voltage Vth is changed when a charge is trapped in a charge storage layer.

A threshold voltage Vth1 of "11" data in the memory cell MC indicates an erased state where the relationship of $0<Vth1<V\_AV$ is satisfied. That is, in this embodiment, an erased state of the memory cell MC is located on a positive side. However, the erased state of the memory cell is not limited to a positive side, and the relationship of $Vth1<0$ may be used to represent the erased state, for example.

The relationship of $V\_AV<Vth2<V\_BV$ is satisfied with respect to a threshold voltage Vth2 of "10" data. The relationship of $V\_BV<Vth3<V\_CV$ is satisfied with respect to a threshold voltage Vth3 of "01" data.

The relationship of $V\_CV<Vth4$ is satisfied with respect to a threshold voltage Vth4 of "00" data. In this manner, the memory cell MC may store any one of "11" data to "00" data, that is, 2 bit data corresponding to a threshold value.

3.2 <FIG. 4B>

To the contrary, as shown in FIG. 4B, a distribution of threshold value of the memory cell MC connected to the word line WL5 to WL7 in the block BLK1 is either "C" level or "E" level. The reason is that data of 1 bit is stored for enhancing the reliability.

When data is read out from the memory cells MC formed in the block BLK1, data is read out at a voltage V_CV.

A reading voltage is not limited to the voltage V_CV, and may be changed corresponding to a characteristic of the memory cell MC. That is, the reading voltage may be a voltage V_AV or a voltage V_BV shown in FIG. 4A corresponding to the characteristic of the memory cell MC.

A level of the threshold value of the memory cell MC connected to the word line WL5 to WL7 is described in this embodiment. A level of a threshold value of the memory cell MC connected to the other word line WL is "E" level, for example, that is, the threshold value of the memory cell MC connected to the other word line WL is in an erased state. This is because the memory cell MC connected to the other word line WL is a memory cell MC in which data is not stored and, at the same time, an influence, such as a disturbance, on the memory cells MC connected to the word line WL5 to WL7 may be prevented. Accordingly, when a voltage VREAD is applied to the memory cells MC in the reading operation described later, the memory cells MC are brought into an ON state.

1.1.2 <Peripheral Circuit 20>

The peripheral circuit 20 includes functional parts such as a control part, a voltage generating circuit, and a sense amplifier not shown in the drawing. Each of the functional parts includes various MOS transistors, signal lines through which a voltage is supplied to the MOS transistors, and a contact plug CP. The MOS transistors, signal lines, contact plugs CP and the like are also arranged directly below the memory cell array 21.

The control part controls the entire memory region, that is, the Plane0 to Plane3. The voltage generating circuit outputs various kinds of voltages for performing writing, reading and erasing data.

For example, the voltage generating circuit outputs a voltage VPGM or a voltage VPASS as a write voltage. The voltage generating circuit further outputs a voltage VCGR, a voltage VREAD, a voltage $VREAD_+$, and a voltage $VREAD_-$ as a reading voltage.

A voltage VCGR is a voltage corresponding to data to be read in the memory cell MC, and a voltage VREAD is a voltage at which the memory cell MC is brought into an ON state.

A voltage $VREAD_+$ and a voltage $VREAD_-$ are voltages which are set by taking into account a boost of the memory string MS, and the voltages VREAD+, VREAD− are smaller than the voltage VREAD.

The sense amplifier executes reading, writing or the like of data.

4. Manner of Operation of Memory Controller 3 Upon Starting Power Supply

Figure 5A:
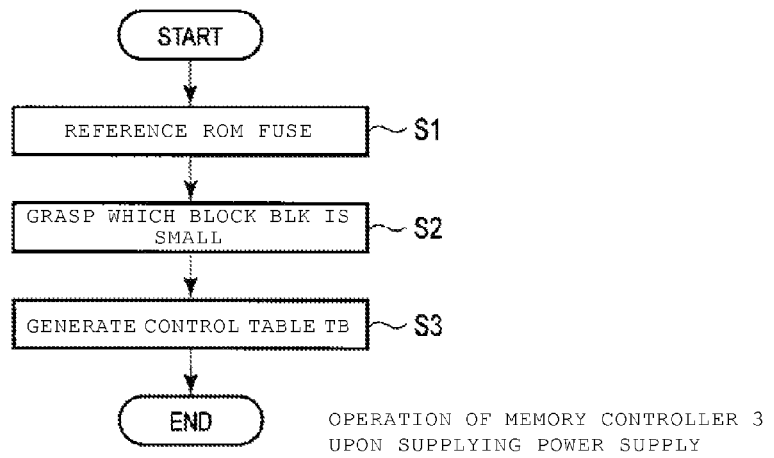
Figure 5B:
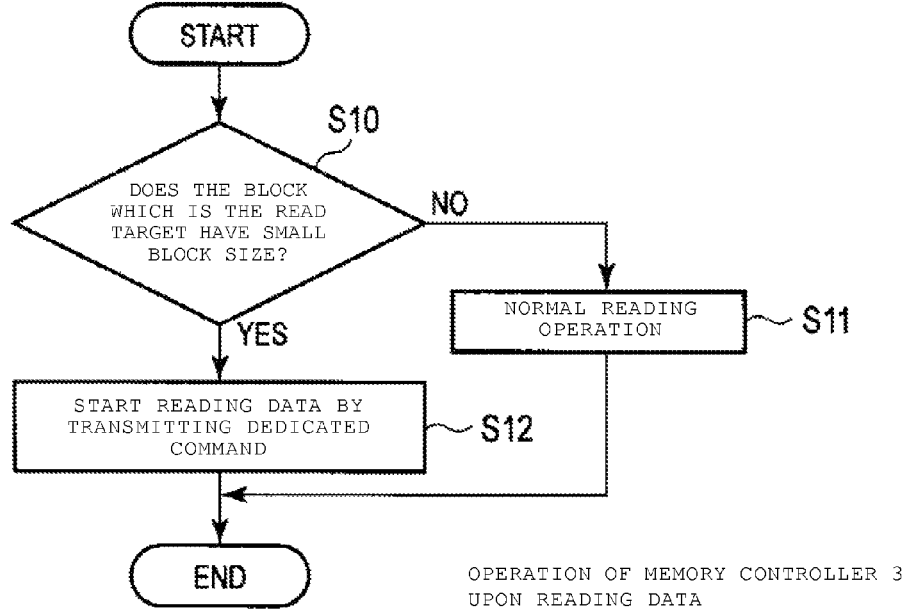

Next, the manner of operation of the memory controller 3 is described with reference to FIG. 5A and FIG. 5B. FIG. 5A is a flowchart showing the manner of operation of the memory controller 3 upon starting the power supply of the memory system 5, and FIG. 5B is a flowchart showing the manner of operation of the memory controller 3 upon reading out data.

4.1 Manner of Operation 1

Firstly, when the power supply is started, as shown in FIG. 5A, the memory controller 3 gets access to a ROM FUSE (not shown in the drawing) arranged in the inside of the non-volatile semiconductor storage device 2, and reads out data stored in the ROM FUSE (step S1).

The ROM FUSE stores management data. In this embodiment, it is assumed that, for example, an address of a block BLK having a small block size (the block BLK1, the block BLKk or the like in FIG. 2) is stored in the ROM FUSE as management data. The address of the block BLK is referred to as a block address BA hereinafter.

That is, the memory controller 3 reads out the block address BA from the ROM FUSE so that the memory controller 3 may identify the block BLK having a small block size (S2).

The ROM FUSE is arranged in the memory cell array 21 in general. In this embodiment, for example, the block BLK1 is the ROM FUSE.

Then, the memory controller 3 generates a control table TB based on data read out from the ROM FUSE (S3).

The control table TB may be arranged in the memory controller 3, or may be arranged in the host apparatus 4.

4.2 Manner of Operation 2

When the reading operation is started, as shown in FIG. 5B, the memory controller 3 determines whether or not the block BLK, which is a read target, corresponds to the block address BA stored in the control table TB by reference in the control table TB (S10).

When the block BLKn which is the read target does not correspond to the block address BA in the control table TB, that is, the block BLK, which is the read target, is a block BLK having a normal size such as the block BLK0 (S10, NO), the memory controller 3 executes the normal reading operation (S11).

To the contrary, when the block address BA of the read target is present in the control table TB, that is, the block BLK, which is the read target, is a block BLK having a small block size, such as the block BLK1 (S10, YES), the memory controller 3 executes the reading operation by transmitting a command described later (S12).

By executing such operations, the proper reading operation is executed on the block BLK having the small block size.

5. Schematic Diagram of Applying Voltage to Word Lines WL Upon Reading Out Data

Next, FIG. 6A to FIG. 6G are schematic diagrams showing a state where a voltage is transferred to the respective word lines WL upon reading out data in the reading operation. In this embodiment, an example is given where data stored in the memory cell MC6 connected to the bit line BL0 and the word line WL6 in the memory string MS1 of the block BLK1 (see FIG. 3) is read out.

That is, a voltage VCGR is transferred to the word line WL6, a voltage $VREAD_+$ is transferred to the word line WL5, a voltage $VREAD_-$ is transferred to the word line WL7, and a voltage VREAD is transferred to the other word lines WL.

Here, data stored in the memory cell MC6 is read out. However, when data stored in the memory cell MC5 connected to the word line WL5 is read out, for example, the voltage generating circuit transfers a voltage $VREAD_+$ to the word line WL4, and transfers a voltage $VREAD_-$ to the word line WL6.

That is, a voltage $VREAD_+$ and a voltage $VREAD_-$ are transferred to the word lines WL arranged on both sides of the selected word line WL, i.e., the word lines WL that interpose the selected word line WL.

In performing the reading operation, for example, a voltage VDD (1.8 V) is transferred to the bit line BL, and the source line SL is grounded.

FIG. 6A to FIG. 6F are cross-sectional views taken along a line 6A-6A', a line 6B-6B', a line 6C-6C', a line 6D-6D', a line 6E-6E', and a line 6F-6F' respectively in the above-mentioned FIG. 3.

Figure 6C:
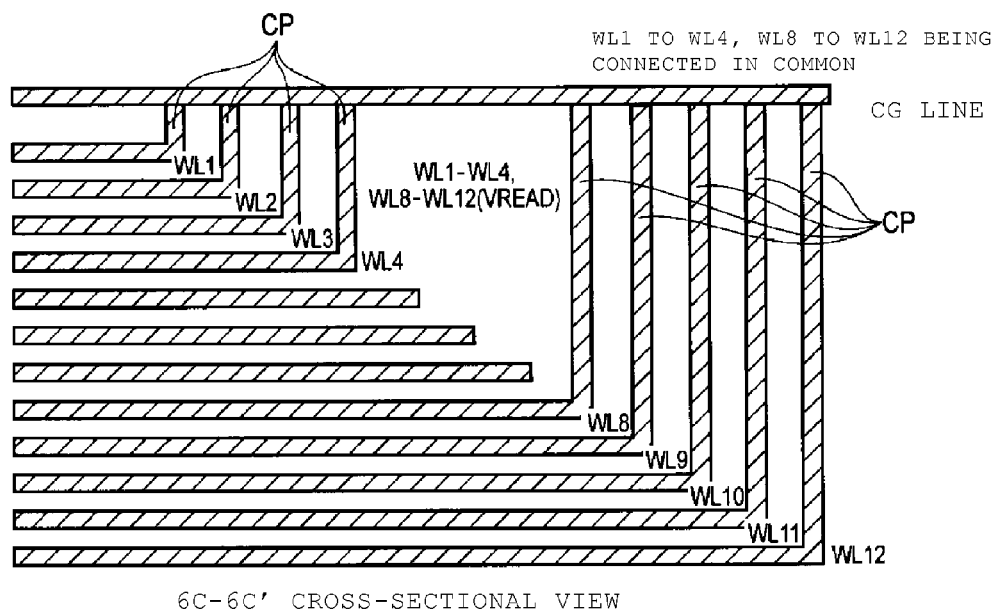
FIG. 6C is a cross-sectional view of the memory cell array according to the first embodiment, and also illustrates a concept of supplying a reading voltage to word lines.
Figure 6D:
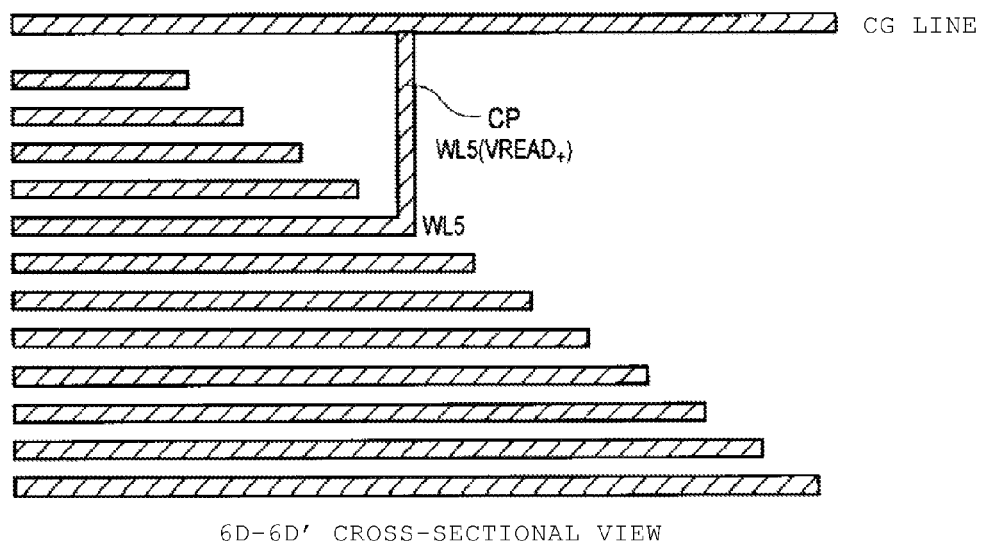
FIG. 6D is a cross-sectional view of the memory cell array according to the first embodiment, and also illustrates a concept of supplying a reading voltage to word lines.
Figure 6E:
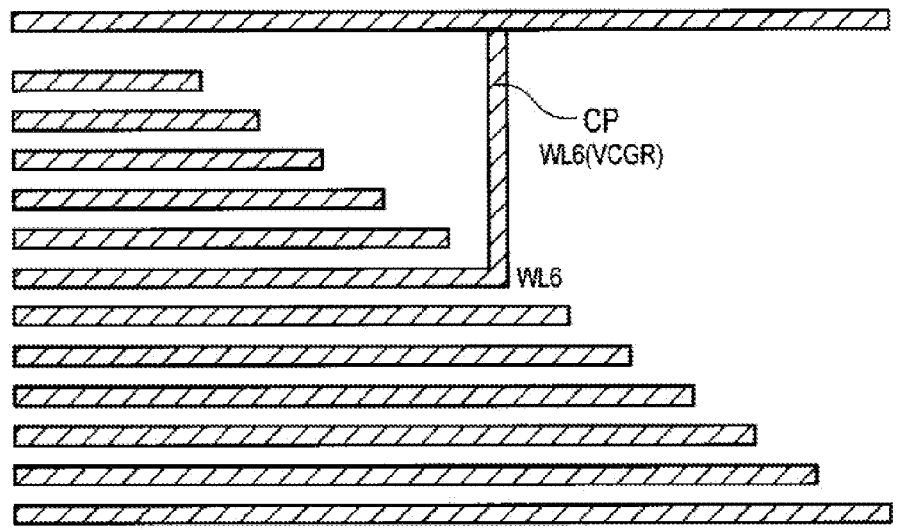
FIG. 6E is a cross-sectional view of the memory cell array according to the first embodiment, and also illustrates a concept of supplying a reading voltage to word lines.
Figure 6F:
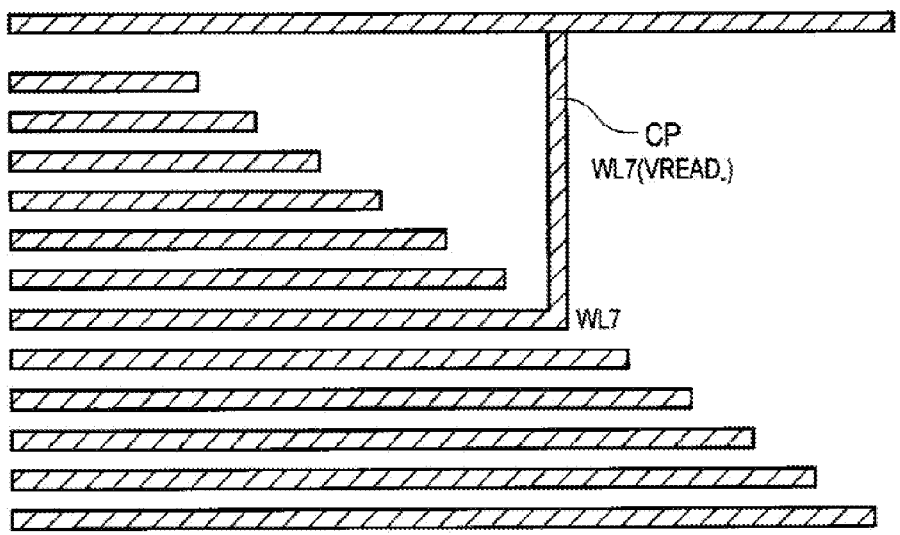
FIG. 6F is a cross-sectional view of the memory cell array according to the first embodiment, and also illustrates a concept of supplying a reading voltage to word lines.
Figure 6G:
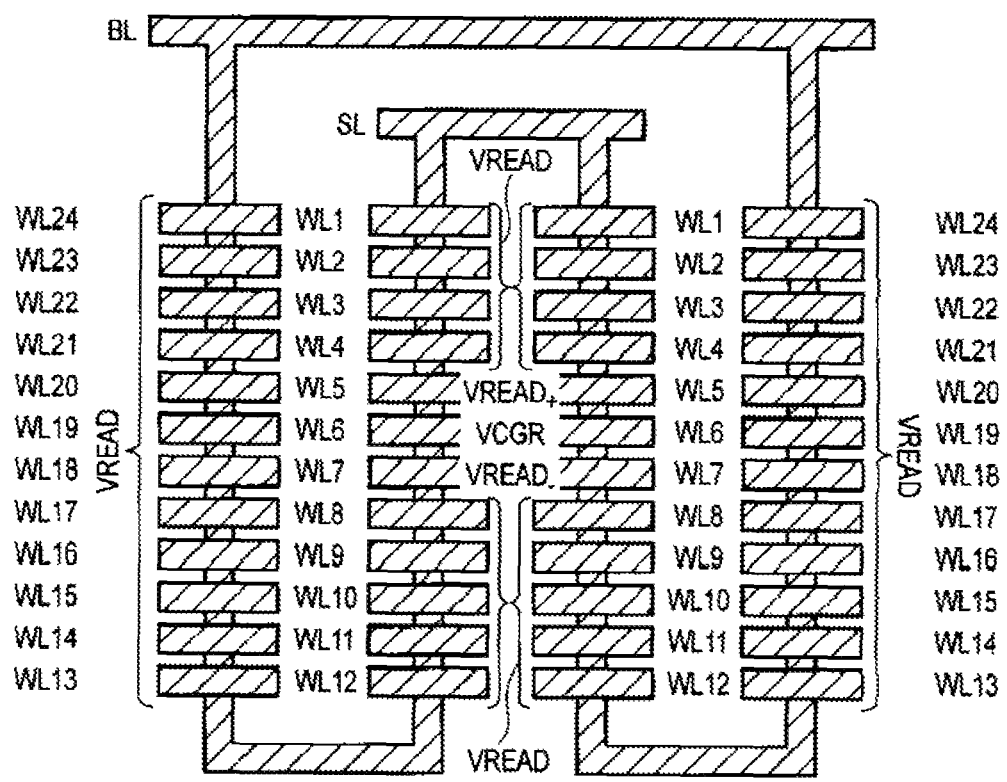
FIG. 6G is a cross-sectional view of the memory cell array according to the first embodiment, and also illustrates a concept of supplying a reading voltage to word lines.

FIG. 6G is a view simply showing a cross section of the block shown in FIG. 3 along the second direction. That is, two memory strings MS are formed using the source line SL in common.

5.1 <FIG. 6A, FIG. 6B>

As described above, FIG. 6A and FIG. 6B are cross-sectional views taken along the line 6A-6A' and the line 6B-6B' in FIG. 3. As shown in FIG. 6A and FIG. 6B, the word lines WL13 to WL18 are connected to the CG line through the same contact plug CP and, in the same manner, the word lines WL19 to WL24 are connected to the CG line through the same contact plug CP.

A voltage VREAD is transferred to the word lines WL13 to WL18 as well as to the word lines WL19 to WL24 through the CG line, for example.

Although a voltage VREAD is transferred through two CG lines in a divided manner as an example in this embodiment, the number of CG lines is not limited to two. For example, one CG line may be used or three CG lines may be used.

When two CG lines are used, as shown in FIG. 6G, a voltage VREAD is transferred to the word lines WL13 to WL24 of the memory string MS.

5.2 <FIG. 6C>

Next, a reading voltage transferred upon reading out data is described with reference to FIG. 6C. As shown in FIG. 6C, the word lines WL1 to WL4, and the word lines WL8 to WL12 are connected to the signal line CG through the same contact plug CP, and a voltage VREAD is transferred to the word lines WL.

Accordingly, as shown in FIG. 6G, a voltage VREAD is transferred to the word lines WL1 to 4 and WL8 to 12 through the signal line CG.

5.3 <FIG. 6D>

Next, a reading voltage transferred upon reading out data is described with reference to FIG. 6D. As shown in FIG. 6D, the word line WL5 is connected to the signal line CG through the contact plug CP.

As shown in FIG. 6G, a voltage $VREAD_+$ is transferred to the word line WL5 through the CG line.

5.4 <FIG. 6E>

Next, a reading voltage transferred upon reading out data is described with reference to FIG. 6E. As shown in FIG. 6E, the word line WL6 is connected to the signal line CG through the contact plug CP.

That is, as shown in FIG. 6G, a voltage VCGR is transferred to the word line WL6 through the CG line. Although the voltage VCGR is 0V (see FIG. 4B), for example, the voltage VCGR is slightly boosted up in accordance with a voltage transferred to the word lines WL arranged above and below the word line WL6.

5.5 <FIG. 6F>

Next, a reading voltage transferred to the word line WL7 upon reading out data is described with reference to FIG. 6F. As shown in FIG. 6F, the word line WL7 is connected to the signal line CG through the contact plug CP.

As shown in FIG. 6G, a voltage $VREAD_-$ is transferred to the word line WL7 through the CG line.

As described above, in reading out data from the block BLK1, voltages shown in FIG. 6A to FIG. 6F are transferred to the respective word lines WL by the voltage generating circuit.

6. Timing Chart of Respective Signals Upon Reading Out Data

Figure 7A:
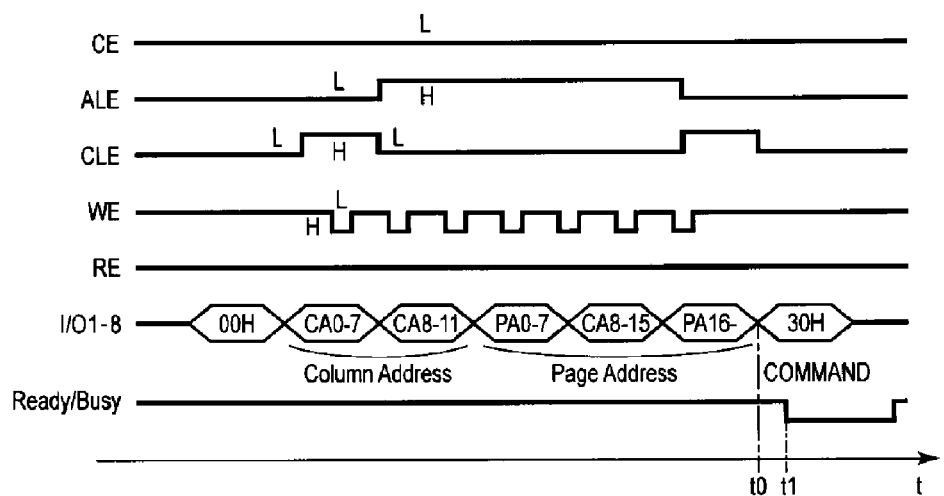
FIG. 7A is a timing chart showing respective signals transferred from a memory controller upon performing the reading operation according to the first embodiment.
Figure 7B:
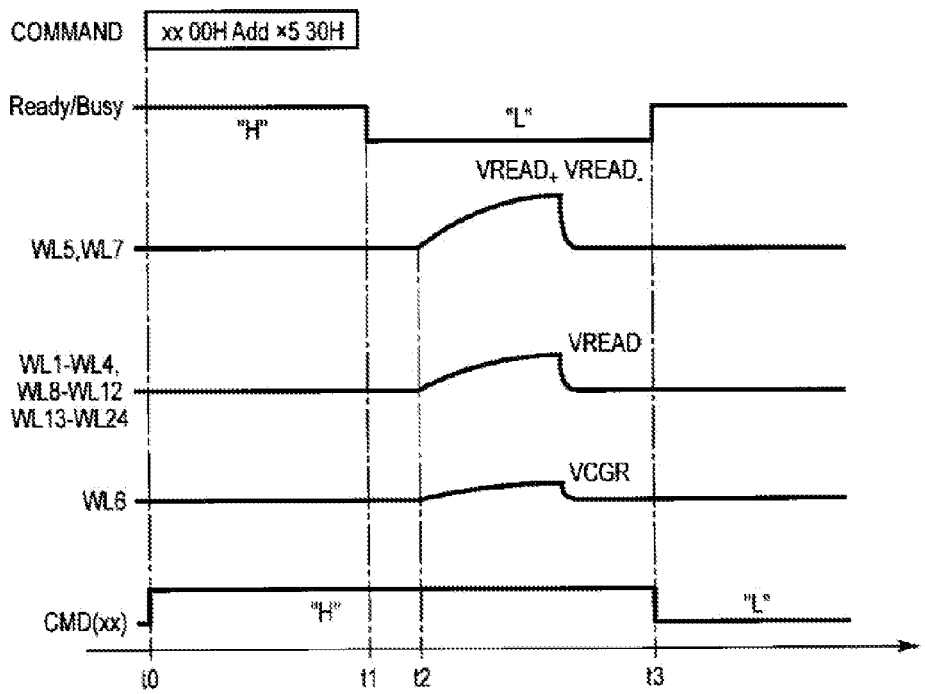
FIG. 7B is a timing chart showing a voltage supplied to word lines and the like upon performing the reading operation according to the first embodiment.

Next, FIG. 7A, FIG. 7B are timing charts of the memory controller 3 and the non-volatile semiconductor storage device 2 upon reading out data.

FIG. 7A is a timing chart of respective signals transmitted to the non-volatile semiconductor storage device 2 from the memory controller 3 upon reading out data.

A chip-enable signal (CE), an address-latch-enable signal (ALE), a command-latch-enable signal (CLE), a write-enable signal, and a read-enable signal which are transmitted from the memory controller 3, data input signals I/O 1 to 8, and a ready or busy signal outputted from a control part arranged in the peripheral equipment 2 are represented on an axis of ordinates, and time t is represented on an axis of abscissas.

FIG. 7A is a chart for facilitating the understanding of FIG. 7B described later and hence, FIG. 7A is simply described here. In FIG. 7A, a timing at which a COMMAND is transferred from the data input signal line is assumed as a time t0 for the sake of convenience.

The manner of operation of the non-volatile semiconductor storage device 2 when a read command is transmitted from the memory controller 3 is described with reference to FIG. 7B. That is, the manner of operation of respective signals when the memory controller 3 performs the reading operation with respect to the block BLK1 is described.

FIG. 7B is a timing chart which focuses on a period after the time t0 in FIG. 7A. A command transmitted from the memory controller 3, a ready or busy signal, a voltage transferred to non-selected signal lines CG (two non-selected CG lines located directly above and below the selected CG line respectively), a voltage transferred to non-selected CG lines (to which the word lines WL are connected in common), a voltage level of the selected signal line CG, and a voltage level of the transmitted command CMD are represented on an axis of ordinates, and time is represented on an axis of abscissas.

<FIG. 7A>

As shown in FIG. 7A, when a voltage level of a chip-enable signal is at "L", a voltage level of a write-enable signal is at "H", a voltage level of a command-latch-enable signal is at "L", and a voltage level of an address-latch-enable signal is at "H", an address (CA0-7 to PA16 in the drawing) is taken in from the host apparatus 4 through the data input signal line.

Next, when a voltage level of a chip-enable signal is at "L", a voltage level of a write-enable signal is at "H", a voltage level of an address-latch-enable signal is at "L", and a voltage level of a command-latch-enable signal is at "H", a command CMD0 (30H) is input through the data input signal line at a time t0.

Then, at a time t1 at which the non-volatile semiconductor storage device 2 starts the reading operation, a voltage level of a ready or busy signal is at "L".

<FIG. 7B>

As described above, when the non-volatile semiconductor storage device 2 receives a command CMD (xx), a command CMD (OOH), an address ADD, and a command (30H) from the host apparatus 4 before the time t0 at which a period of a ready state (Busy signal="H" level) terminates, the control part in the peripheral circuit 20 transmits a Busy signal (Busy signal="L" level) at the time t1. The Busy signal is transmitted to the memory controller 3.

A command "00H" is an instruction command instructing the start of the reading operation, and a command "xx" is a command which is arranged ahead of a read command. Based on the instruction command "xx", the control part (memory controller 3) recognizes that a block BLK having a small block size is a read target.

Thereafter, the control part performs a control such that the voltage generating circuit generates voltages to be transmitted to the respective word lines WL at a time t2, and the generated voltages are transferred to the respective word lines WL through the CG line.

To be more specific, the control part transfers reading voltages described in FIG. 6G to the respective word lines WL. That is, the control part transfers a voltage VREAD to the word lines WL1 to WL4 and word lines WL8 to WL12 which are connected to the contact plug CP in common, transfers a voltage $VREAD_+$ to the word line WL5, transfers a voltage VCGR (=V_CV) to the word line WL6, and transfers a voltage $VREAD\_$ to the word line WL7.

A threshold voltage of the memory cells MC corresponding to the word lines WL1 to WL4, WL8 to WL12 (hereinafter referred to as memory cells MC1 to MC4, MC8 to MC12) is at an "E" level so that the memory cells MC1 to MC4, MC8 to MC12 are turned on.

Accordingly, when the memory cell MC connected to the word line WL6 (hereinafter referred to as memory cell MC6) is brought into an ON state so that an electric current flows through the memory string MS, it is found that data stored in the memory cell MC6 is "1".

To the contrary, when the memory string MS is not brought into a conductive state, it is found that data stored in the memory cell MC6 is "0".

Then, when the reading operation is finished, a voltage of the respective word lines WL is lowered, and a ready or busy signal is at "H" level at a time t3 at which the reading operation is finished.

Advantageous Effects Acquired by First Embodiment

The non-volatile semiconductor storage device according to the first embodiment may realize the following advantageous effects (1) to (3).

(1) It is possible to enhance the reliability of data (Advantageous effect 1). According to the non-volatile semiconductor storage device according to this embodiment, data is stored in a memory cell MC in the memory string MS that provides excellent characteristics, such as data storing characteristic.

To be more specific, data is stored in the memory cell MC which may have excellent characteristics as described above, and is located in the vicinity of the center in the direction toward the depth direction of the paper on which the drawing is drawn. For example, data is stored in the memory cell MC6 as illustrated in the first embodiment.

With respect to the other memory cells MC, there is a tendency, for example, where the memory cells MC6 and MC12 that are farther away in the upward direction and the memory cells MC6 and MC12 that are farther away in the downward direction, have deteriorated characteristics (e.g., data storing characteristic). That is, the memory cells MC0, MC1, MC22, and MC23 where a diameter of a memory hole MH is large, and the memory cells MC10, MC11, MC12, and MC13 where a diameter of a memory hole MH is small make such other memory cells MC.

In view of the above, according to the first embodiment, the reliability of data storage is enhanced by selecting the memory cell MC6 which is considered to have the best characteristics in the memory string MS to store data.

The memory cell MC19 also has excellent characteristics in the same manner as the memory cell MC6 and hence, data may be stored in the memory cell MC19.

(2) It is possible to enhance the reliability of data (Advantageous effect 2).

The non-volatile semiconductor storage device according to the first embodiment may suppress the influence, such as by disturbance. This is because, in the non-volatile semiconductor storage device according to the first embodiment, data is not stored in the memory cells MC corresponding to word lines other than the word line WL6.

That is, for example, there is no possibility that data stored in the memory cell MC6 is influenced by data stored in the memory cells MC5, MC7 which correspond to the word lines WL5, WL7 adjacent to the word line WL6, because data is not stored in the memory cells MC5, MC7.

In this manner, the memory cell MC6 focused in this embodiment has a low possibility of being influenced by disturbance so that a possibility that data stored in the memory cell MC6 is changed with the passage of time is low. That is, the reliability of data may be enhanced.

(3) A size of the block BLK may be decreased (Advantageous effect 3).

In the non-volatile semiconductor storage device according to the first embodiment, as shown in FIG. 3, the word lines WL are used in common and hence, it is sufficient to set the number of word lines WL formed in the block BLK1 to six.

To further facilitate the understanding of the advantageous effect 3, a comparison example is described. The explanation is made by using the block BLK0 as the comparison example, for example.

The block BLK0 has the structure equal to the conventional structure. To be more specific, the block BLK0 has the structure where two word lines WL pass through one memory string MS. A plurality of word lines WL are not connected in common using one contact plug CP, and one block BLK is formed of twelve memory strings MS and hence, twenty-four in total signal lines CG are connected to the block BLK0.

In the comparison example, it is assumed that data is not stored in the memory cells MC other than the memory cell MC6 to which the word line WL6 is connected, for example, regardless of the size of the block BLK.

That is, the comparison example is provided for achieving the same purpose as the first embodiment. That is, the purpose of the comparison example lies in the use of memory cells MC having an excellent data storing characteristic.

That is, in the case of the comparison example, lines other than the signal line CG through which a voltage is transferred to the word line WL6 are unnecessary. That is, although a region not used exists in the block BLK, the block BLK is large and hence, an area of the Plane is increased as a whole.

To the contrary, in the non-volatile semiconductor storage device according to this embodiment, the word lines WL which correspond to non-use memory cells MC are connected in common so that the number of signal lines CG, that is, a width of the signal line CG arranged in the second direction may be decreased to the width W_BLK1.

Although data is stored in the memory cell MC6 in the memory string MS in the first embodiment, the memory cell which stores data is not limited to the memory cell MC6.

For example, data may be stored in the memory cell MC5 and MC7 which are adjacent to the memory cell MC6 and also have good characteristics. In this case, a threshold voltage of the memory cells MC1 to MC4, the memory cells MC8 to MC12, and the memory cells MC13 to MC24 is at an "E" level.

Second Embodiment

Next, a non-volatile semiconductor storage device according to the second embodiment is described with reference to FIG. 8 and FIG. 9. The second embodiment differs from the first embodiment in that the block BLKk of the first embodiment is used as a ROM FUSE region.

That is, in the same manner as described above, a case where one memory string MS includes word lines WL1 to WL24 is assumed.

In this embodiment, for example, data is stored in a memory cell MC6 corresponding to a word line WL6 and a memory cell MC19 corresponding to a word line WL19 adjacent to the word line WL6, and data is not stored in memory cells MC other than the memory cells MC6, MC19.

That is, in reading out data in the memory cell MC19, it is sufficient that a voltage VCGR is transferred to the word line WL19, a voltage VREAD+ and a voltage VREAD− are transferred to word lines WL18, WL20 which are adjacent to the word line WL19 respectively, and a voltage VREAD is transferred to the other word lines WL1 to WL17 and WL21 to WL24.

It is assumed that the block BLKk also has the same block size as the block BLK1. That is, memory string units MU0 to MS3 are formed in the block BLKk.

Hereinafter, only the portions of this embodiment that differ from the first embodiment are described.

1. Configuration Example 1.1 First Configuration Example

Figure 8:
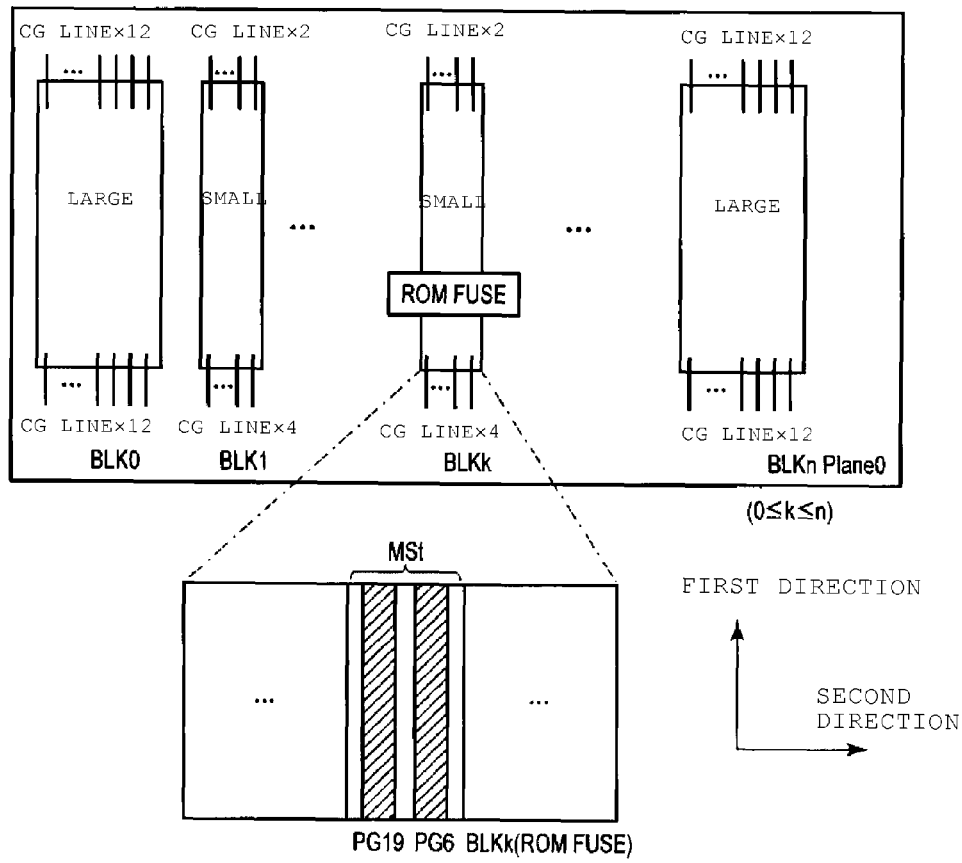
FIG. 8 is a plan view of a block according to a second embodiment, and is also a schematic diagram when the block is used as a ROM FUSE.

FIG. 8 shows an example of the overall configuration of a Plane0 when the block BLKk is used as the ROM. FUSE. As shown in an enlarged view of the block BLKk in FIG. 8, for example, management data is stored in a plurality of memory cells MC which correspond to the word line WL6 (PG6 in the drawing) and the word line WL19 (PG19 in the drawing) in the memory string MSt ($0 \le t \le 11$).

In this embodiment, "page" means a unit based on which data is read out collectively. To describe such a page with reference to FIG. 8, for example, the page means an assembly formed by arranging memory cells MC connected to the same word line WL along the bit line BL direction when data of 1 bit is stored in the respective memory cells.

In the memory cell MC which functions as the ROM FUSE, in addition to the above-mentioned block address BA, address information on a bad block, redundancy information, and trimming information are stored in units of 1 bit.

1.2 Second Configuration Example

In the same manner as 1.1 first constitutional example, the case where a block BLKk is used as a ROM FUSE is described with reference to FIG. 9. FIG. 9 is a schematic diagram of one example where two memory string units MUt and MU (t+1) are used as the ROM FUSE region, for example.

Figure 9:
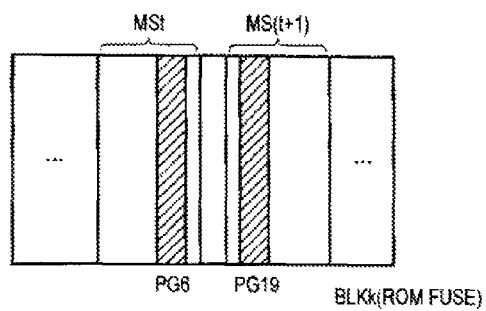
FIG. 9 is a schematic diagram when the block according to the second embodiment is used as a ROM FUSE.

As shown in FIG. 9, in the memory string unit MUt, data is stored in a plurality of memory cells MC6 which correspond to a word line WL6 (PG6 in the drawing).

In the memory string unit MU (t+1), data is stored in a plurality of memory cells MC19 which correspond to a word line WL19 (PG19 in the drawing).

In this manner, the plurality of memory string units MU may be used as the ROM FUSE.

Advantageous Effects Realized by Second Embodiment

The non-volatile semiconductor storage device according to the second embodiment may also realize the advantageous effects (1) and (2) discussed above.

It is necessary for data stored in the ROM FUSE region not to be changed irrespective of a lapse of time or a change in environment such as a temperature. That is, it is necessary to store data in a memory cell MC having the reliability from a viewpoint of storing data.

The non-volatile semiconductor storage device according to the second embodiment is provided to satisfy such necessity, and is configured such that the memory cell MC which stores data is not influenced by the disturbance from memory cells MC adjacent to the memory cell. That is, for example, the non-volatile semiconductor storage device according to the second embodiment has a configuration that where memory cell MC6 is not influenced by the word lines WL5 and WL7, and is not also influenced by the word line WL19.

Further, the memory cell MC having excellent data storing characteristics is used.

Accordingly, the non-volatile semiconductor storage device according to the second embodiment may also realize the advantageous effects (1) to (3) discussed above.

Third Embodiment

Next, a non-volatile semiconductor storage device according to the third embodiment is described with reference to FIG. 10A and FIG. 10B. Although the plurality of word lines WL are connected in common in the first and second embodiments, the non-volatile semiconductor storage device according to the third embodiment adopts a configuration where predetermined bit lines BL are connected in common. Hereinafter, only the portions of the third embodiment that differ from the first and second embodiments are described.

Figure 10A:
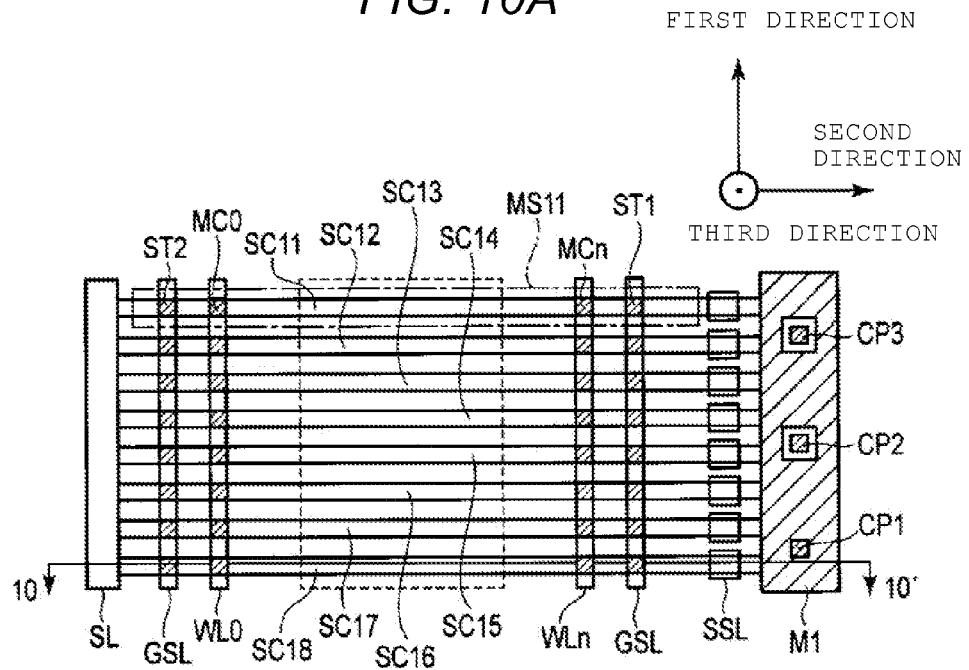
Figure 10B:
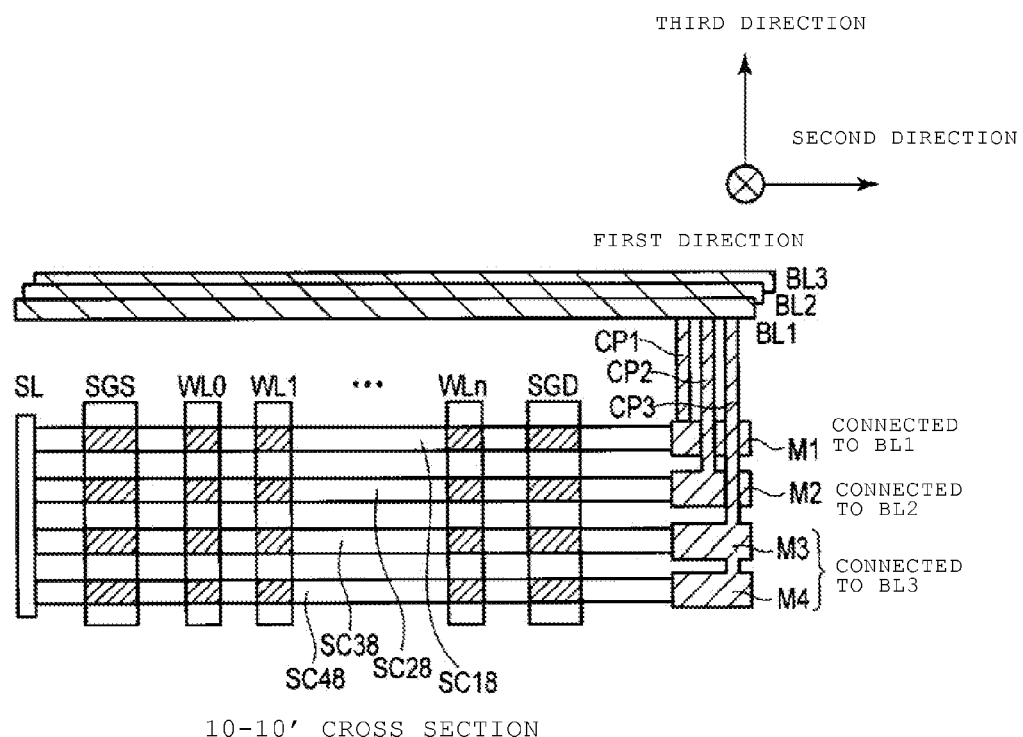

FIG. 10A is a plan view of a Plane0 according to the third embodiment, and FIG. 10B is a cross-sectional view of FIG. 10A. As shown in FIG. 10A, only the uppermost layer is shown in FIG. 10A. In the actual configuration, however, as shown in FIG. 10B, the same configuration is arranged in a plurality of layers in the direction toward the depth direction of the paper on which drawing is drawn. In this embodiment, it is assumed that four layers are arranged for the sake of convenience. The explanation given hereinafter applies to every semiconductor layer SC.

1. Configuration Example

Uppermost Layer (First Layer)

As shown in FIG. 10A, a metal layer M1, an SSL, a signal line SGD, word lines WL0 . . . , WLn, a signal line SGS, and a source SL are arranged in the second direction.

Next, the semiconductor layers SC11 to SC18 which are terminated at a source line SL and a metal layer M1 respectively, and penetrate the SSL, the signal line SGD, the word lines WL0 . . . , WLn, and the signal line SGS in the second direction are formed. The semiconductor layer is simply referred to as "semiconductor layer SC" hereinafter when it is unnecessary to distinguish the semiconductor layers SC11 to SC18 from each other.

Here, the semiconductor layers SC11 to SC18 mean the semiconductor layers SC1 to SC8 on the first layer. Memory strings MS11 to MS18, which are described later, mean memory strings MS1 to MS8 on the first layer.

That is, a selection transistor ST2 is arranged at intersections of the semiconductor layers SC and the signal line SGS, and a selection transistor ST1 is arranged at intersections of the semiconductor layers SC and the signal line SGD (hatched portions in the drawing).

A memory cell MC (hatched portion in the drawing) is arranged at intersections of the semiconductor layers SC and the word lines WL0, . . . , WLn respectively.

That is, for example, with respect to the semiconductor layer SC11, a memory string MS11 is formed such that the memory string MS11 includes the selection transistors ST1, ST2, a plurality of memory cells MC0 to MCn which have both ends thereof interposed by the selection transistors ST1, and ST2, and the source line SL.

In the same manner, memory strings MS12 to MS18 are formed in semiconductor layers SC12 to SC18.

Second Layer

Semiconductor layers SC21 to SC28 on the second layer counted from the uppermost layer (semiconductor layers SC21 to SC27 not shown in FIG. 10B) are connected in common by a metal layer M2 and, further, are connected to a bit line BL2 through the contact plug CP2.

That is, memory strings MS21 to MS28 stacked on the second layer constitute the sub block BLK2.

Third Layer and Fourth Layer

As shown in FIG. 10B, semiconductor layers SC31 to SC38 on the third layer counted from the uppermost layer (semiconductor layers SC31 to SC37 not shown in FIG. 10B) are connected in common by a metal layer M3. Semiconductor layers SC41 to SC48 on the lowermost layer (semiconductor layers SC41 to SC47 not shown in FIG. 10B) are connected in common by a metal layer M4.

Further, a contact plug CP3 is formed such that the contact plug CP3 penetrates the metal layers M3 and M4 and has an upper surface thereof connected to the bit line BL3.

That is, the metal layers M3 and M4 are connected in common by the contact plug CP3. Accordingly, the memory strings MS31 to MS38, MS41 to MS48 stacked on the third layer and the fourth layer constitute a sub block BLK3.

As described above, a block BLK includes an assembly of the sub blocks BLK1 to BLK3.

The non-volatile semiconductor storage device according to the third embodiment adopts such structure and hence, instead of the structure where four semiconductor layers SC are stacked, the number of bit lines BL, that is, a distance in the first direction (direction toward the depth direction) may be decreased.

As described above, in the third embodiment, although semiconductor layers SC in four layers are described as an example for the sake of convenience, the number of layers is not limited to four. For example, the number of stacked semiconductor layers SC may be equal to the number of stacked semiconductor layers SC in the first embodiment.

When the number of stacked semiconductor layers SC is twenty-four, metal layers M1 to M24 connected to the semiconductor layers SC1 to SC24 are formed.

In the same manner as the first and second embodiments, a plurality of metal layers M may be connected in common by a contact plug CP for decreasing the block size.

In the conventional configuration, when contact plugs CP1 to CP24 are connected to metal layers M1 to M24, respectively, the same number of bit lines BL as the contact plugs CP1 to CP24 become necessary.

On the other hand, when only a region where the block BLK exists is used, for example, it is sufficient to connect metal layers M1 to M7, M18 to M24 in common by one contact plug CP. Accordingly, in such a case, the number of bit lines BL in the first direction may be decreased by ten.

In this manner, even when the number of stacked semiconductor layers SC is equal to that of the conventional configuration, the block size may be decreased by performing the method of connecting the metal layer M and the contact plug CP.

<Modification>

Next, a non-volatile semiconductor storage device according to a modification of the third embodiment is described with reference to FIG. 11A and FIG. 11B. This modification differs from the third embodiment in that all metal layers M in respective layers are connected in common by a contact plug CP, and the source lines SL are connected in common. Only the portions of this modification that differ from the third embodiment are described below.

1. Configuration Example

Figure 11A:
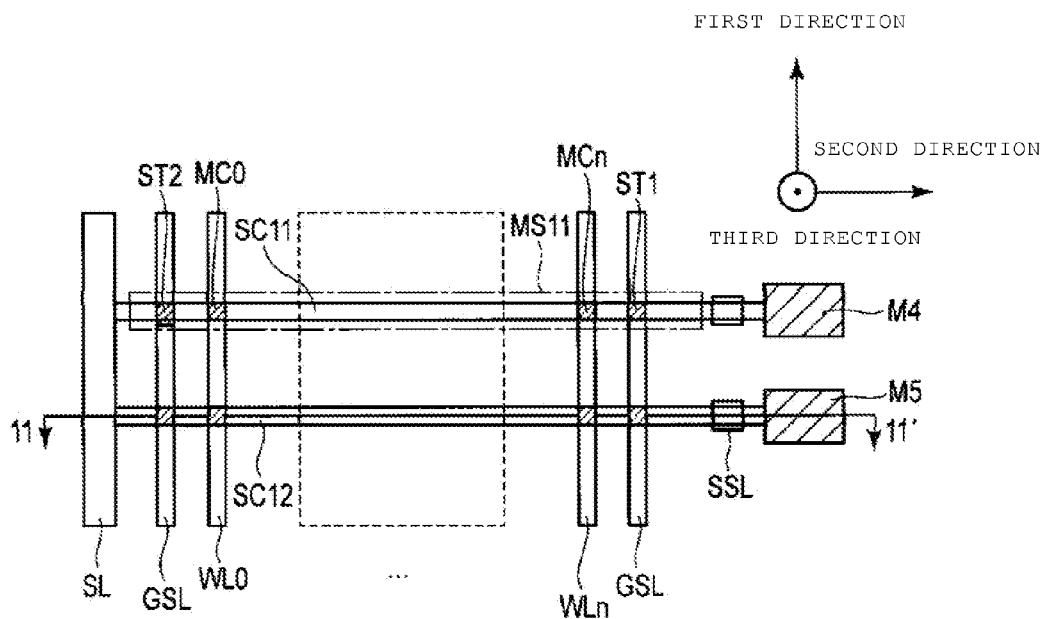
Figure 11B:
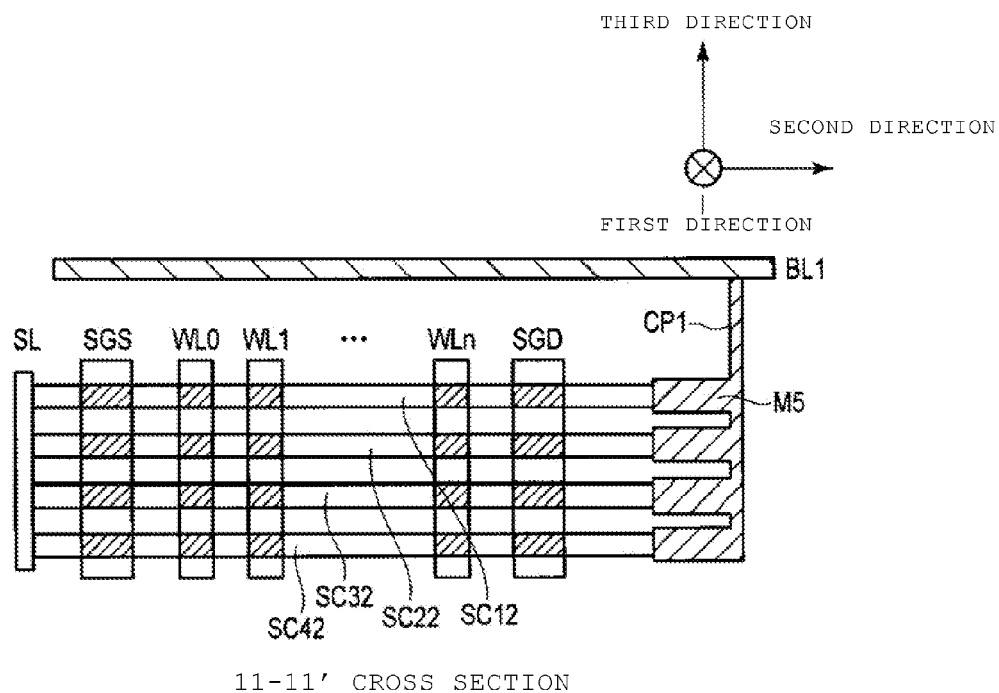

FIG. 11A is a plan view, and FIG. 11B is a cross-sectional view taken along a line 11-11' in FIG. 11A.

As shown in FIG. 11A, semiconductor layers SC11 and SC12 formed along the first direction are arranged such that the semiconductor layers SC11 and SC12 extend in the second direction. One end of the semiconductor layer SC11 is connected to a metal layer M4, and the other end of the semiconductor layer SC11 is connected to a source line SL.

In the same manner, one end of the semiconductor layer SC12 is connected to a metal layer M5, and the other end of the semiconductor layer SC12 is connected to a source line SL.

As shown in FIG. 11B, for example, the semiconductor layers SC12 to SC42 are connected in common by the metal layer M5.

That is, for example, respective memory cells MC formed in the semiconductor layers SC12 to SC42 store the same data.

The respective memory cells MC formed in the semiconductor layers SC11 to SC41 have the substantially same configuration and hence, the explanation of the memory cells MC is omitted.

<Advantageous Effects Realized by Modification>

A non-volatile semiconductor storage device according to the modification may also acquire the substantially same advantageous effects as the third embodiment.

That is, by changing the method of connecting the metal layer M and the contact plug CP, a block size may be varied. To be more specific, the number of bit lines BL arranged in the first direction may be decreased and hence, a block size is not enlarged even when the number of stacked semiconductor layers is increased.

In the above-mentioned embodiments, as one example, the explanation is made with respect to the case where the memory cells MC which correspond to the word lines WL formed on the fifth, sixth and seventh layers counted from the top among twelve layers are used as the regions where user data is stored. However, the user data storing region is not limited to such memory cells MC.

For example, provided that the block where the memory cell MC has an excellent characteristic is used, word lines WL formed on fourth to eighth layers counted from the top among twelve layers may be used. To the contrary, provided that the block where the memory cell MC does not have an excellent characteristic is used, word lines WL formed on sixth and seventh layers counted from the top among twelve layers may be used.

Fourth Embodiment

Next, a non-volatile semiconductor storage device according to the fourth embodiment is described. The fourth embodiment differs from the first to third embodiments in that each of Plane0 to Plane3 is formed of a plurality of NAND strings arranged on a plane.

Hereinafter, only the portions of this embodiment that differ from the above-mentioned embodiments are described.

1. Constitutional Example

Figure 12:
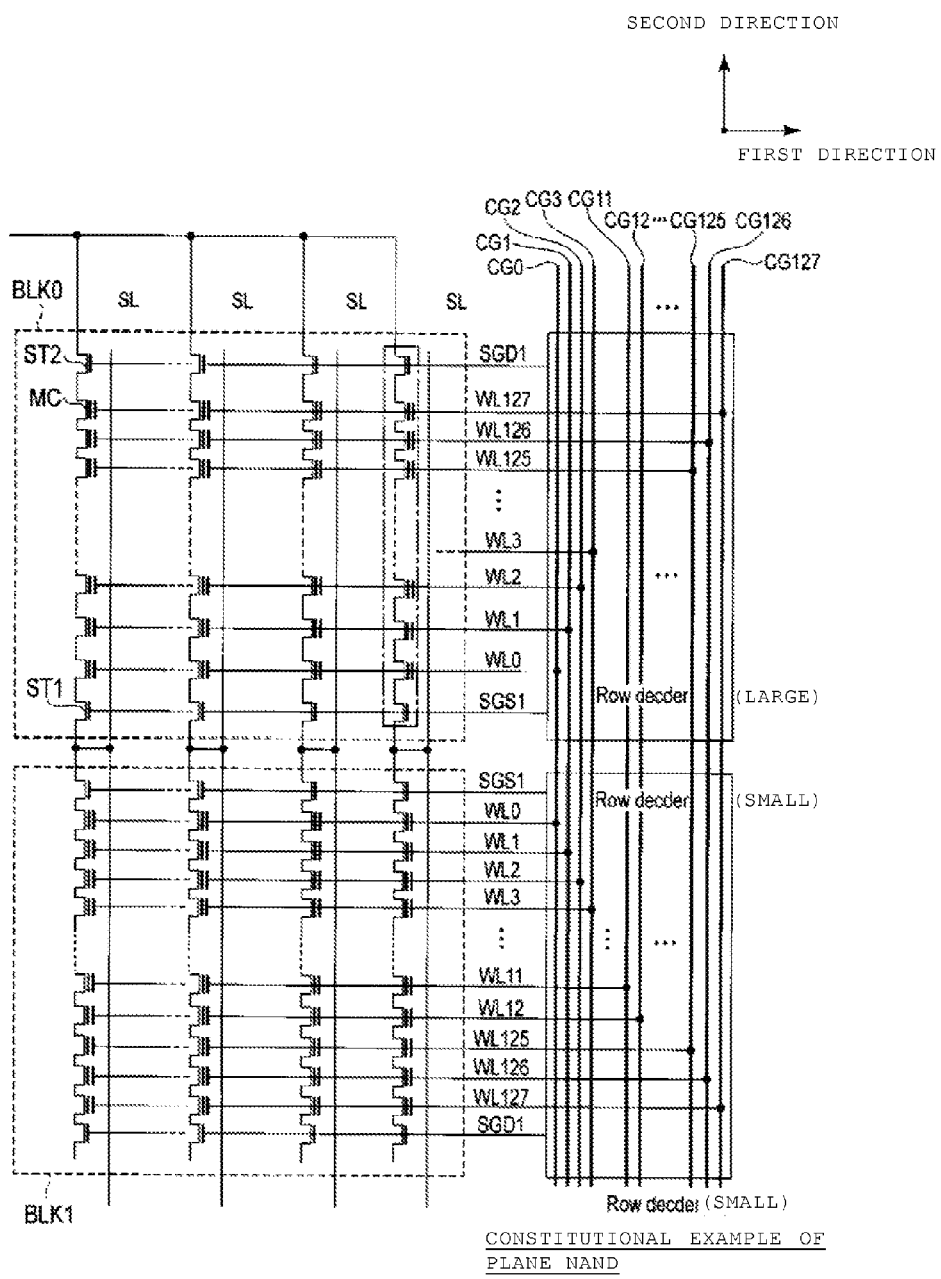
FIG. 12 is a plan view of a memory cell array according to a fourth embodiment.

FIG. 12 is a plan view of a Plane0 according to this embodiment. Plane1 to Plane3 have the same configuration as the Plane0 and hence, the explanation of the Plane1 to Plane3 is omitted.

The Plane0 includes a block BLK0 and a block BLK1, for example. In this embodiment, the block BLK0 has a larger block size than the block BLK1. That is, the block BLK0 is used as a user data region, and the block BLK1 is used as a ROM FUSE region.

1.1 <Block BLK0>

As shown in FIG. 12, word lines WL0 to WL127 are formed on the block BLK0, and the respective word lines WL0 to WL127 are connected to corresponding CG line 0 to CG line 127.

1.2 <Block BLK1>

Sixteen word lines WL are formed in the block BLK1. The sixteen word lines WL are made to be associated with the word lines WL0 to WL12, and the word lines WL125 to WL127.

Accordingly, in the block BLK1, the word lines WL0 to WL12 are connected to the CG line 0 to CG line 12 respectively, and three word lines WL which function as the word line WL125 to WL127 are connected to the CG line 125 to CG line 127 respectively.

In this manner, by adopting the configuration which thins out the word lines WL13 to WL124, a block size in the Plane0 may be decreased when necessary.

In the block BLK1, for example, the word line WL5 is used as the ROM FUSE. In other words, a Page including the word line WL5 is used as the ROM FUSE.

This is because, in performing the data writing operation, to prevent erroneous writing with respect to a non-write bit, it is necessary to transfer a voltage corresponding to a boost option such as a voltage VISO, a voltage VGP or a voltage VPASS to approximately ±6 non-selected word lines WL than the selected word line WL.

A voltage VISO is a voltage at which the memory cell MC is turned off irrespective of stored data. For example, the voltage VISO is a voltage which electrically separates the selected word line WL and non-selected word lines WL from each other.

A voltage VGP is an intermediate potential supplied to a memory cell MC (for example, WL4, WL6) arranged between a VISO (for example, WL5) and a VPASS (for example, WL3, WL7).

In this manner, for example, when the word line WL5 is used as the selected word line WL, a non-selected voltage may be transferred to the word lines WL0 to WL4, and the word lines WL6 to WL12.

A control voltage which differs from the non-selected voltage is transferred to the word lines WL125 to WL127. In this case, approximately three word lines, that is, the word lines WL125 to WL127 may be suitably used.

As has been described above, the non-volatile semiconductor storage device according to the fourth embodiment also may suppress the disturbance, may enhance the reliability of data, and achieve a decrease in size. That is, the non-volatile semiconductor storage device according to the fourth embodiment may realize the advantageous effects (1) to (3).

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
    a memory cell array which includes a plurality of memory cells divided into first and second blocks, each of which includes a plurality of memory strings each having n (n: natural number) memory cells, the first memory block including a first memory string of n memory cells electrically connected in series and the second memory block including a second memory string of n memory cells electrically connected in series, wherein
    n first signal lines extending in a first direction are arranged in the first block along a second direction different from the first direction, the first signal lines being electrically connected to first word lines, each of the first word lines being electrically connected to a gate of a respective one of the memory cells of the first memory string and not electrically connected to a gate of any other memory cell of the first memory string, each of the first signal lines being electrically connected to a respective one of the first word lines and not electrically connected to any of the other first word lines, and
    m (n>m, m: natural number) second signal lines extending in the first direction are arranged in the second block along the second direction, the second signal lines being electrically connected to second word lines, each of the second word lines being electrically connected to a gate of a respective one of the memory cells of the second memory string and not electrically connected to a gate of any other memory cell of the second memory string, at least one of the second signal lines being electrically connected to more than one of the second word lines.

2. The non-volatile semiconductor storage device according to claim 1, wherein a width of the first block in the second direction is greater than that of the second block in the second direction.

3. The non-volatile semiconductor storage device according to claim 2, wherein
    the first word lines and the second word lines are respectively stacked above a substrate, and
    the second word lines include a first group, a second group, and a third group between the first group and the second group, each of the second word lines in the first and second groups being commonly electrically connected to one of the second signal lines with at least one of the other second word lines in the first and second groups.

4. The non-volatile semiconductor storage device according to claim 3, wherein
    the first signal lines are electrically connected to the first word lines through n first plugs, and
    the second signal lines are electrically connected to the second word lines through n second plugs, at least one of the second signal lines being commonly electrically connected to k second word lines through k second plugs, where k is two or more.

5. The non-volatile semiconductor storage device according to claim 4, wherein
    the second word lines in the first group are commonly electrically connected to one of the second signal lines through multiple second plugs, and
    the second word lines in the second group are commonly electrically connected to another one of the second signal lines through multiple second plugs.

6. The non-volatile semiconductor storage device according to claim 5, wherein
    the second word lines in the third group are each independently electrically connected to one of the second signal lines through one of the second plugs.

7. The non-volatile semiconductor storage device according to claim 6, wherein the number of second word lines in the third group is three.

8. The non-volatile semiconductor storage device according to claim 7, further comprising:
    a peripheral circuit including a voltage generating circuit configured to generate a reading voltage, a first voltage which brings the memory cell into an ON state, and a second voltage which brings the memory cell into an ON state, and wherein
    the voltage generating circuit, when reading out data from a memory cell in the second block, supplies the reading voltage to a gate of the memory cell through a second word line in the third group and the first voltage to the second word lines connected to gates of the memory cells adjacent to the memory cell, and the second voltage to the remaining second word lines.

9. The non-volatile semiconductor storage device according to claim 2, wherein
    the second block stores management data indicating addresses of other blocks having a width in the first direction that is less than that of the first block.

10. A memory system comprising:
    a non-volatile semiconductor storage device including
        a memory cell array which includes a plurality of memory cells divided into first and second blocks, each of which includes a plurality of memory strings each having n (n: natural number) memory cells, the first memory block including a first memory string of memory cells electrically connected in series and the second memory block including a second memory string of memory cells electrically connected in series, wherein
        n first signal lines extending in a first direction are arranged in the first block along a second direction different from the first direction, the first signal lines being electrically connected to first word lines, each of the first word lines being electrically connected to a gate of a respective one of the memory cells of the first memory string and not electrically connected to a gate of any other memory cell of the first memory string, each of the first signal lines being electrically connected to a respective one of the first word lines and not electrically connected to any of the other first word lines, and
        m (n>m, m: natural number) second signal lines extending in the first direction are arranged in the second block along the second direction, the second signal lines being electrically connected to a gate of a respective one of the memory cells of the second memory string and not electrically connected to a gate of any other memory cell of the second memory string, at least one of the second signal lines being electrically connected to more than one of the second word lines; and a memory controller configured to control the non-volatile semiconductor storage device, wherein the memory controller, when the non-volatile semiconductor storage device is activated, executes a first reading operation on memory cells in the second block to determine if a third block, which is targeted in a second reading operation, has a block size smaller than that of the first block.

11. The memory system according to claim 10, wherein the second block stores management data.

12. The memory system according to claim 10, wherein a width of the first block in the second direction is greater than that of the second block in the second direction.

13. The memory system according to claim 10, wherein the first word lines and the second word lines are respectively stacked on a substrate, and the second word lines include a first group, a second group, and a third group between the first group and the second group, each of the second word lines in the first and second groups being commonly electrically connected to one of the second signal lines with at least one of the other second word lines in the first and second groups.

14. The memory system according to claim 13, wherein the first signal lines are electrically connected to the first word lines through n first plugs, and the second signal lines are electrically connected to the second word lines through n second plugs, at least one of the second signal lines being commonly electrically connected to k second word lines through k second plugs, where k is two or more.

15. The memory system according to claim 14, wherein the second word lines in the first group are commonly electrically connected to one of the second signal lines through multiple second plugs, and the second word lines in the second group are commonly electrically connected to another one of the second signal lines through multiple second plugs.

16. The memory system according to claim 15, wherein the second word lines in the third group are each independently electrically connected to one of the second signal lines through one of the second plugs.

17. The memory system according to claim 16, wherein the number of second word lines in the third group is three.

18. The memory system according to claim 13, further comprising:

a peripheral circuit including a voltage generating circuit configured to generate a reading voltage, a first voltage which brings the memory cell into an ON state, and a second voltage which brings the memory cell into an ON state, and wherein the voltage generating circuit, when reading out data from a memory cell in the second block, supplies the reading voltage to a gate of the memory cell through a second word line in the third group and the first voltage to the second word lines connected to gates of the memory cells adjacent to the memory cell, and the second voltage to the remaining second word lines.

* * * * *